(12) United States Patent
Toyoda et al.

(10) Patent No.: US 6,638,864 B2
(45) Date of Patent: Oct. 28, 2003

(54) METHOD FOR REMOVING RESIST MATERIAL

(75) Inventors: Eiji Toyoda, Ibaraki (JP); Haruo Ioka, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/146,895

(22) Filed: May 17, 2002

(65) Prior Publication Data

US 2002/0173151 A1 Nov. 21, 2002

(30) Foreign Application Priority Data

May 18, 2001 (JP) ..................... P.2001-149295

(51) Int. Cl.$^7$ ..................... H01L 21/302; H01L 21/461
(52) U.S. Cl. ..................................... 438/690
(58) Field of Search ................. 438/690, 689, 438/800; 156/257; 430/165; 522/154

(56) References Cited

U.S. PATENT DOCUMENTS

| | | | | |
|---|---|---|---|---|
| 4,691,045 A | * | 9/1987 | Fukuchi et al. | 522/154 |
| 6,080,522 A | * | 6/2000 | Ito et al. | 430/165 |
| 6,126,772 A | * | 10/2000 | Yamamoto et al. | 156/247 |

OTHER PUBLICATIONS

Derwent Abstracted Publication No. JP10158601A Nitto Corp. "Pressure sensitive adhesive tape for removal of resists . . . " Nov. 29, 1996.*

* cited by examiner

Primary Examiner—Craig Thompson
(74) Attorney, Agent, or Firm—Sughrue Mion, PLLC

(57) ABSTRACT

The invention provides a method for removing a resist material existing on an article by adhering a pressure-sensitive adhesive sheet onto the surface of a resist material and releasing both the pressure-sensitive adhesive sheet and the resist material in an integrated state to thereby remove the resist material from the article, in which method the resist material has a Young's modulus of 0.5 MPa or more upon releasing.

10 Claims, No Drawings

METHOD FOR REMOVING RESIST MATERIAL

BACKGROUND OF THE INVENTION

1. Field of the Invention

The present invention relates to a method for removing an unnecessary resist material on an article such as a semiconductor wafer in a step of forming a fine pattern involved in a process of manufacturing semiconductors, circuits, various printed boards or liquid crystal panels. The process of the invention is described hereinafter by reference to an example of manufacturing semiconductors. However, the invention is not limited only to the use, and may be applied to an article having a resist material on its surface and, in particular, it is preferably employed for removing a thick resist material on a wafer which becomes unnecessary after plating.

2. Description of the Related Art

In manufacturing semiconductor devices, a step of coating (applying) a resist material on a wafer such as silicon, forming a resist pattern image through a common photographic procedure, plating or etching using the resist as a mask, and removing the unnecessary resist material is repeatedly conducted. In the case of forming a circuit on various substrates (boards), unnecessary resist materials are removed.

With an increase in degree of pattern density or integration of LSI and an increase in degree of pattern density or size of liquid crystal panels, it is of importance to simply and surely remove unnecessary materials existing on semiconductor wafers or glass substrates in view of yield and reliability of products. As the step for removing unnecessary resist materials, there have conventionally been commonly employed a wet removing method using a resist-removing chemical solution and a dry removing method using an asher (a carbonizing apparatus) but, with resist materials having a large thickness, the removing method using a chemical solution has mainly been employed in view of throughput.

However, the removing method using a chemical solution requires to use a large quantity of harmful chemicals, and involves a fear for detrimental influences on the working environment and a problem that measures for protecting environment is burdensome. In addition, there is a fear of adverse affects on product properties or yield such as damages of a device surface with the chemical solution or re-adhesion of the resist having once been removed with the chemical solution.

In order to solve these problems, there has been proposed a simple method of removing a resist material using a pressure-sensitive adhesive sheet in a form of sheet or tape (hereinafter, sometimes referred to merely as a pressure-sensitive adhesive sheet). This method comprises adhering a pressure-sensitive adhesive sheet onto an article having provided thereon a resist material to firmly fix the resist material to the pressure-sensitive adhesive layer, and releasing both the pressure-sensitive adhesive sheet and the resist material in an integrated state (i.e., releasing the pressure-sensitive adhesive sheet and the resist material at the same time) to thereby remove the resist material from the article. This method does not involve the problems with other conventional methods and thus serves to improve yield of products.

With the above-described removing method using a pressure-sensitive adhesive sheet, however, there have often been cases where the resist material cannot completely be removed from the surface of an article such as a semiconductor substrate, with part of the resist material remaining on the article. Particularly in releasing the resist material from a wafer after plating the wafer in a step of, for example, forming a bump on the wafer, there have frequently been involved a problem that the resist material remains on the side of the bump or on the surface of the wafer substrate due to internal failure (also called cohesive failure) of the resist material.

SUMMARY OF THE INVENTION

Therefore, an object of the invention is to improve the method of releasing a resist material using a pressure-sensitive adhesive to thereby surely remove such resist material as described above from an article.

As a result of intensive investigations to attain the above-described object, the inventors have found that, in releasing a pressure-sensitive adhesive sheet adhered onto an article such as a semiconductor substrate, the resist can simply and surely be removed from the article with preventing internal failure of the resist material and thus leaving no resist material on the article, by using a material having strong dynamic properties against deformation as the resist material, thus having completed the invention.

That is, the invention provides (1) a method for removing a resist material by adhering a pressure-sensitive adhesive sheet onto the surface of a resist material existing on an article and releasing both the pressure-sensitive adhesive sheet and the resist material in an integrated state to thereby remove the resist material on the article, in which method the resist material has a Young's modulus of 0.5 MPa or more upon releasing; (2) a method for removing a resist material by adhering a pressure-sensitive adhesive sheet onto the surface of a resist material existing on an article and releasing both the pressure-sensitive adhesive sheet and the resist material in an integrated state to thereby remove the resist material on the article, in which method the resist material has a tensile strength at break of 0.5 MPa or more upon releasing; (3) a method for removing a resist material by adhering a pressure-sensitive adhesive sheet onto the surface of a resist material existing on an article and releasing both the pressure-sensitive adhesive sheet and the resist material in an integrated state to thereby remove the resist material on the article, in which method the resist material has a tensile elongation at break of 30% or more upon releasing; (4) the method for removing a resist material as described in one of (1) to (3), wherein the resist material has rubber elasticity; (5) the method for removing a resist material as described in one of (1) to (3), wherein the resist material contains a rubbery component; (6) the method for removing a resist material as described in one of (1) to (3), wherein the resist material contains a urethane component; and (7) the method for removing a resist material as described in one of (1) to (3), wherein the resist material contains a cyclized rubber and/or a bisazide compound.

DETAILED DESCRIPTION OF THE INVENTION

In the invention, an article on which a resist material exists includes, for example, an article such as a semiconductor substrate or a glass substrate which is in a state wherein a known resist material is coated on the article, a predetermined resist pattern (resist film image) is formed through a common photographic process, and various treatments such as metal plating or etching is conducted at the openings of the resist. Here, the resist material commonly has a thickness of about 1 μm to about 150 μm, though not being particularly limited thereto.

In the invention, a pressure-sensitive adhesive sheet is adhered onto the upper surface of the resist material existing on the article. As the pressure-sensitive adhesive sheet, known pressure-sensitive adhesive sheets for releasing a resist material are used, with those which have good adhesion properties to a resist material being preferably used.

The resist material to be used in the invention has such tough dynamic properties against deformation that it can be peeled off with leaving no residues on the article without causing internal failure such as break or tearing upon releasing operation through the pressure-sensitive adhesive sheet. As a resist material composition capable of exhibiting such properties, there may be considered various combinations and, for example, it is effective for imparting rubber elasticity to the resist material. The rubber elasticity herein means elasticity that rubber or rubber-like material shows generally. Such a material has a property where it is difficult to break against deformation due to stress. As resist materials useful for the purpose, there are illustrated, for example, a resist material containing a cyclized rubber component or a bisazide component, and a resist material containing a urethane compound. Since such resist materials show such a high cohesion force that, upon releasing, there arises no such failure as that there remains some residues on the article due to progress of break within the resist material, and that the resist material can be released always in an integrated state from the article. Specifically, resist materials having a Young's modulus in tension of 0.5 MPa or more are preferred, with those of 0.6 MPa or more being more preferred, and those of 1 MPa or more being still more preferred. The upper limit of the Young's modulus in tension may be 3000 MPa. Also, good results can be obtained by using resist materials having a tensile strength at break of 0.5 MPa or more, preferably 0.8 MPa or more, more preferably 2 MPa or more. The upper limit of the tensile strength at break may be 200 MPa. Further, good results can also be obtained by using resist materials having an elongation at break of 30% or more, preferably 45% or more, more preferably 100% or more. The upper limit of the elongation at break may be 2000%.

Here, Young's modulus, tensile strength at break and tensile elongation at break were measured according to JIS K-7113 (1995). (sample: 10 mm in width; chuck-to-chuck distance: 10 mm; testing speed: 50 mm/min)

Modulus in tension, Em, of JIS K-7113 is calculated by Δσ/Δε, but the Young's modulus in the invention is a modulus in tension, Em, obtained by calculating Δε from strain of 0% to 100%.

In addition, tensile strength at break and tensile elongation at break respectively mean the tensile break strength and tensile break elongation described in JIS K7113.

In the present invention, the Young's modulus, tensile strength at break and tensile elongation at break were generally measured at 120 to 170° C.

As the rubbery component, which may be contained in the resist material, various known rubbery components may be used, but examples thereof include natural rubbers containing poly isopyrene as a main component, and synthetic rubbers like styrene-butadiene rubber, butadiene rubber or ethylene-propylene rubber. While the amount of the rubbery component is not limited, the resist material may generally contain the rubbery component in an amount of 3 to 50 wt %.

As the urethane component, which may be contained in the resist material, various compounds having a urethane bond in a molecule thereof may be used, but examples thereof include functional group-containing urethane oligomers (e.g., (meth)acrylate functional urethane oligomer, or epoxy functional urethane oligomer). While the amount of the urethane component is not limited, the resist material may generally contain the urethane component in an amount of 3 to 50 wt %.

As the cyclized rubber compound, which may be contained in the resist material, conventionally known compounds may be used, but examples thereof include cyclized natural rubber, cyclized polyisoprene, cyclized polyisobutylene, cyclized polybutadiene. While the amount of the cyclized rubber compound is not limited, the resist may generally contain the cyclized rubber compound in an amount of 3 to 50 wt %.

Examples of the bisazide compound, which may be contained in the resist material, include 4,4'-diazidechalcone, 4,4'-diazidediphenyl, 4,4'-diazidestylbene, 2,6-bis(4'-azidebenzal)cyclohexanone-3-methylcyclohexanone, 2,6-bis(4'-azidebenzal)-4-methylcyclohexanone. While the amount of the bisazide compound is not limited, the resist may generally contain the bisazide compound in an amount of 3 to 50 wt %.

An operation of adhering a pressure-sensitive adhesive sheet onto a resist material is desirably conducted under applying heat and pressure for the purpose of closely joining the pressure-sensitive adhesive layer to the resist to unify, an operation of releasing the resist material may be conducted at ordinary temperatures but, for the purpose of optimizing elastic properties of the resist material and reducing adhesion between the article surface and the resist, it is preferred to heat to a temperature in the range of from 50° C. to 200° C.

As the pressure-sensitive adhesive sheet used herein, various pressure-sensitive adhesive sheets for use in releasing resists may be used. Usually, they are in the form of sheet or tape wherein a pressure-sensitive adhesive layer of 20 to 150 μm in thickness is provided on a film substrate. As the film substrate, there may be used plastic films of usually 10 to 1,000 μm in thickness composed of various synthetic resins such as polyester, polycarbonate, polyethylene, polypropylene, ethylene-propylene copolymer, ethylene-vinyl acetate copolymer and ethylene-ethyl acrylate copolymer.

Also, the pressure-sensitive adhesive layer may be of non-curing type but, in order to completely release the resist material, those of curing type are preferred. For a pressure-sensitive adhesive layer of curing type, there may be used those pressure-sensitive adhesives which can be cured (solidified) by cooling from a heated state, such as hot-melt type pressure-sensitive adhesives, and those polymerization-curing type pressure-sensitive adhesives which contain a curing compound and a polymerization catalyst in a pressure-sensitive adhesive polymer such as an acrylic polymer. Of these, polymerization-curing type pressure-sensitive adhesives, in particular UV-curing pressure-sensitive adhesives, are preferred.

The invention is described more specifically by reference to Examples.

EXAMPLE 1

A negative-working dry film resist (120 μm thick) composed of a mixture of a cyclized rubber component and an acrylic resin component was laminated on the surface of a silicon wafer on which a semiconductor element had been formed, followed by conducting exposure and development in a conventional manner to form a pattern. Thereafter, copper bump plating (100 μm thick) was conducted on the wafer surface using the resist pattern as a mask. Onto the image pattern thus formed on the silicon wafer was laminated a UV-curing type, resist-releasing, pressure-sensitive adhesive sheet at 140° C. and held for 1 minute under heating. Subsequently, UV irradiation (irradiation amount: 1 J/cm$^2$) was conducted from above the sheet using a high-pressure mercury lamp, followed by peeling off the pressure-sensitive adhesive sheet at 140° C. to remove the resist material. Observation of the resist-free wafer surface under a microscope revealed that no residues remained on the side of the bump, thus the resist material being completely removed. The resist material showed a Young's modulus of 0.6 MPa, a strength at break of 0.8 MPa and an elongation at break of 45% at 140° C.

EXAMPLE 2

A resist material was released and removed in absolutely the same manner as in Example 1 except for using an acrylic resist material having a Young's modulus of 0.7 MPa, a strength at break of 0.4 MPa and an elongation at break of 20%, and it was found that the resist material was almost released and removed, but small residues of the resist material were confirmed in about 1% of the side portion of the bump.

EXAMPLE 3

A resist material was released and removed in absolutely the same manner as in Example 1 except for using an acrylic resist material having a Young's modulus of 0.2 MPa, a strength at break of 1 MPa and an elongation at break of 20%, and it was found that the resist material was almost released and removed, but small residues of the resist material were confirmed in about 5% of the side portion of the bump.

EXAMPLE 4

A resist material was released and removed in absolutely the same manner as in Example 1 except for using an acrylic resist material having a Young's modulus of 0.4 MPa, a strength at break of 0.3 MPa and an elongation at break of 100%, and it was found that the resist material was almost released and removed, but small residues of the resist material were confirmed in about 1% of the side portion of the bump.

COMPARATIVE EXAMPLE 1

A resist material was released and removed in absolutely the same manner as in Example 1 except for using an acrylic resist material having a Young's modulus of 0.1 MPa, a strength at break of 0.2 MPa and an elongation at break of 20%, and it was found that residues of the resist material were almost released and removed, but small residues of the resist material were confirmed in almost all of the side portion of the bump.

As has been described herein before, the invention can provide a method for releasing and removing a resist material in a simple and sure manner by adhering a pressure-sensitive adhesive sheet onto the resist material on an article such as a semiconductor substrate, in which the resist material has rubber elasticity which serves to prevent internal failure of the resist layer, thus reliability of releasing the resist being improved.

This application is based on Japanese patent application JP 2001-149295, filed May 18, 2001, the entire content of which is hereby incorporated by reference, the same as if set forth at length.

What is claimed is:

1. A method for removing resist material, which comprises:

adhering a pressure-sensitive adhesive sheet onto an upper surface of a resist material, the resist material existing on an article; and releasing the pressure-sensitive adhesive sheet and the resist material at the same time so as to remove the resist material from the article;

wherein the resist material has a Young's modulus of 0.5 MPa or more upon releasing, and the resist material has a tensile elongation at break of 30% or more upon releasing.

2. The method for removing a resist material according to claim 1, wherein the resist material has a tensile strength at break of 0.5 MPa or more upon releasing.

3. The method for removing a resist material according to claim 1, wherein the resist material has rubber elasticity.

4. The method for removing a resist material according to claim 2, wherein the resist material has rubber elasticity.

5. The method for removing a resist material according to claim 1, wherein the resist material contains a rubbery component.

6. The method for removing a resist material according to claim 2, wherein the resist material contains a rubbery component.

7. The method for removing a resist material according to claim 1, wherein the resist material contains a urethane component.

8. The method for removing a resist material according to claim 2, wherein the resist material contains a urethane component.

9. The method for removing a resist material according to claim 1, wherein the resist material contains at least one of a cyclized rubber and a bisazide compound.

10. The method for removing a resist material according to claim 2, wherein the resist material contains at least one of a cyclized rubber and a bisazide compound.

* * * * *